United States Patent [19]

Eitrheim et al.

[11] Patent Number: 4,663,546

[45] Date of Patent: May 5, 1987

[54] TWO STATE SYNCHRONIZER

[75] Inventors: John K. Eitrheim, Cedar Park; Bernard J. Pappert; Ashok H. Someshwar, both of Austin, all of Tex.

[73] Assignee: Motorola, Inc., Schaumburg, Ill.

[21] Appl. No.: 831,209

[22] Filed: Feb. 20, 1986

[51] Int. Cl.$^4$ .................. H03K 5/13; H03L 7/00; H03D 13/00

[52] U.S. Cl. .................... 307/527; 307/269; 307/481; 307/530

[58] Field of Search ............... 307/443, 452, 480–481, 307/523, 526, 527, 528, 530, 269

[56] References Cited

U.S. PATENT DOCUMENTS

| | | | |
|---|---|---|---|
| 4,469,964 | 9/1984 | Guttag et al. .................. | 307/279 |
| 4,504,748 | 3/1985 | Oritani .......................... | 307/279 |
| 4,558,241 | 12/1985 | Suzuki et al. .................. | 307/530 |

Primary Examiner—Stanley D. Miller
Assistant Examiner—M. R. Wambach
Attorney, Agent, or Firm—John A. Fisher; Jeffrey Van Myers

[57] ABSTRACT

A two stage synchronizer circuit for synchronizing an asynchronous input signal with a local clock signal includes a reference inverter for generating a reference signal, a first sense amplifier for amplifying the difference between the reference signal and the asynchronous input signal, buffer inverters coupled to the output on the sense amplifier, a second sense amplifier coupled to the output of the buffer inverters, and an output inverter for delivering the desired synchronized signal. The reference inverter and the first and second buffer inverters have the same switch point so as to substantially reduce the probability of the generation of a meta-stable output. Furthermore, the first and second sense amplifiers and output inverter also have the same switch point as the reference inverter.

7 Claims, 1 Drawing Figure

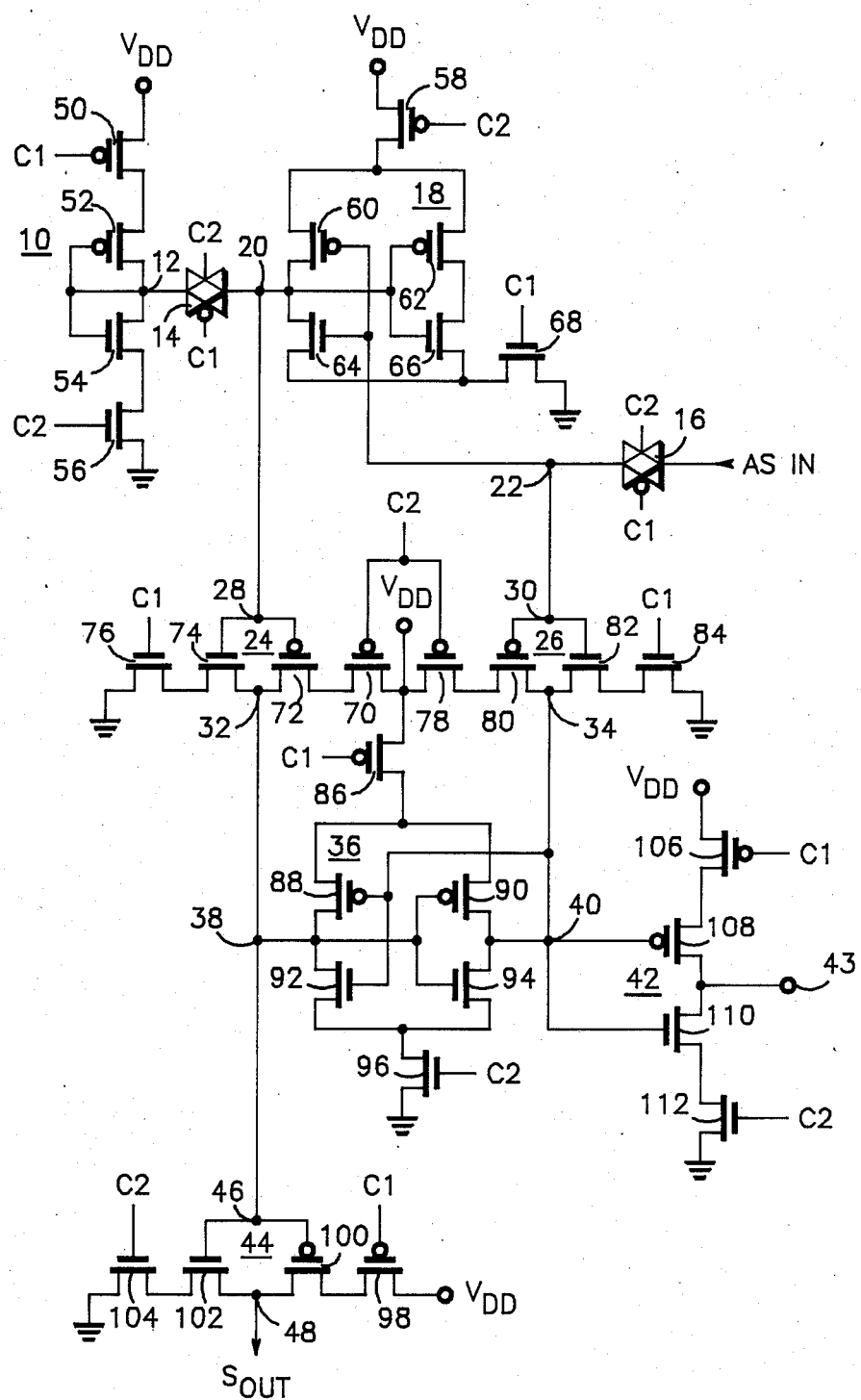

TWO STATE SYNCHRONIZER

BACKGROUND OF THE INVENTION

This invention relates generally to a synchronizer circuit for synchronizing an asynchronous input signal to an internal clock signal, and more particularly, to a two stage CMOS synchronizer circuit having matched switch (threshold) points.

In order to optimize speed and performance, it is often necessary to operate different portions of a digital processing system at different clock frequencies. This requires that certain portions of the system be capable of receiving and processing signals which are asynchronous with respect to a local clock signal. To avoid metastable states (intermediate voltage levels due to the sampling of asynchronous inputs without a guaranteed set up time) and to generate full voltage swing control signals, synchronizer circuits are employed to receive the asynchronous input signal and synchronize it with the local clock signal.

A synchronizer circuit may include first and second stages of differential sense amplifiers separated by buffer circuitry. Unfortunately, if the switch point of the buffer circuitry does not match that of the first stage sense amplifier and if the output differential voltage of the first stage sense amplifier is very small (e.g. 200 millivolts), the input to the second stage sense amplifier may not be sufficiently amplified by the buffer circuitry. This occurs since the gain of the buffer circuitry is highest at its switch point which may not necessarily coincide with that of the first stage sense amplifier. The problem is further aggravated if the second stage sense amplifier has a switch point which is not matched to that of the first stage sense amplifier and buffer circuitry. It is therefore necessary to provide a synchronizer circuit which is characterized by matched switch points.

SUMMARY OF THE INVENTION

It is an object of the present invention to provide an improved synchronizer circuit.

It is a further object of the present invention to provide a synchronizer circuit wherein the switch point of the input sense amplifier is matched to that of the output buffer circuitry.

It is a still further object of the present invention to provide a two stage synchronizer circuit wherein both sense amplifiers and intermediate buffer circuitry are characterized by matched switch points.

According to a broad aspect of the invention there is provided a circuit for synchronizing an asynchronous input signal with a clock signal, comprising a reference inverter coupled to a source of supply voltage for generating a reference voltage at a first output thereof; a first sense amplifier having a first node coupled to said first output and having a second node coupled to receive said asynchronous input signal, said first sense amplifier for amplifying voltage differential across said first and second nodes during a first portion of said clock signal; a first buffer inverter having an input coupled to said first node and having an output; and a second buffer inverter having an input coupled to said second node and having an output, said reference inverter and said first and second buffer inverters having substantially the same switch point.

BRIEF DESCRIPTION OF THE DRAWINGS

The above and other objects, features and advantages of the present invention will be more clearly understood from the following detailed description taken in conjunction with the accompanying drawing which is a schematic diagram of the inventive two stage synchronizer circuit.

DESCRIPTION OF THE PREFERRED EMBODIMENT

The inventive two stage synchronizer circuit comprises an input reference inverter 10 having an output node 12, first and second transmission gates 14 and 16, a first sense amplifier 18 having input nodes 20 and 22, first and second buffer inverters 24 and 26 having input nodes 28 and 30 respectively and output nodes 32 and 34 respectively, a second sense amplifier 36 having input nodes 38 and 40, a dummy load 42, and an output inverter 44 having input node 46 and output node 48.

Input inverter 10 is comprised of first and second P-Channel field effect transistors 50 and 52 and first and second N-Channel field effect transistors 54 and 56. The source electrode of transistor 50 is coupled to a source of supply voltage $V_{DD}$, and its drain electrode is coupled to the source electrode of transistor 52. The drain electrode of transistor 52 is coupled to output node 12 and to the drain electrode of transistor 54. The source of electrode of transistor 54 is coupled to the drain electrode of transistor 56 which has a source electrode coupled to ground.

The gate electrodes of transistors 50 and 56 are coupled respectively to receive first and second complimentary clock signals C1 and C2 (i.e. both C1 and C2 are substantially square wave clock signals 180 degrees out of phase. Output node 12 is coupled to the gate electrodes of transistors 52 and 54. Thus, field effect transistors 50, 52, 54 and 56 are coupled so as to produce a reference voltage (approximately $V_{DD}/2$) at output node 12.

The first sense amplifier 18 is comprised of first, second and third P-Channel field effect transistors 58, 60 and 62 and first, second and third N-Channel field effect transistors 64, 66 and 68. Transistor 58 has a source electrode coupled to receive $V_{DD}$ and a drain electrode coupled to the source electrodes of transistors 60 and 62. The drain electrodes of transistors 60 and 64 are coupled to node 20 as are the gate electrodes of transistors 62 and 66. Similarly, the drain electrodes of transistors 62 and 66 are coupled to node 22 as are the gate electrodes of transistors 60 and 64. Transistor 68 has a source electrode coupled to ground and a drain electrode coupled to the source electrodes of transistors 64 and 66. Clock signals C1 and C2 are applied respectively to the gate electrodes of transistors 68 and 58.

Buffer inverter 24 includes P-channel field effect transistors 70 and 72 and N-channel field effect transistors at 74 and 76. The source of transistor 70 is coupled to $V_{DD}$, and its drain is coupled to the source of transistor 72. The drain electrode of transistor 72 and the drain electrode of transistor 74 are coupled to output node 32. The source electrode of transistor 74 is coupled to the drain electrode of transistor 76 which has a source electrode coupled to ground. The gate electrodes of transistors 72 and 74 are coupled to input node 28 which is in turn coupled to node 20 of sense amplifier 18. The gate electrodes of transistors 70 and 76 are coupled to clock signals C2 and C1 respectively.

Buffer inverter 26 is comprised of P-channel field effect transistors 78 and 80 and N-channel field effect transistors 82 and 84. The source of transistor 78 is coupled to $V_{DD}$ while its drain is coupled to the source of transistor 80. The drain electrodes of transistor 80 and 82 are coupled to output node 34. The source electrode of transistor 82 is coupled to the drain electrode of transistor 84 which has a source electrode coupled to ground. The gate electrodes of transistors 80 and 82 are coupled to input node 30 which is in turn coupled to node 22 of sense amplifier 18. The gate electrodes of transistors 78 and 84 are coupled to clock signals C2 and C1 respectively.

Sense amplifier 36 comprises P-channel field effect transistors 86, 88 and 90, and N-channel field effect transistors 92, 94 and 96. The source of transistor 86 is coupled to $V_{DD}$ while its drain is coupled to the source electrodes of transistors 88 and 90. The source electrode of transistor 96 is coupled to ground while its drain electrode is coupled to the source electrodes of transistors 92 and 94. The drain electrodes of transistors 88 and 92 are coupled to node 38 as are the gate electrodes of transistors 90 and 94. Similarly, the drain electrodes of transistors 90 and 94 are coupled to node 40 as are the gate electrodes of transistors 88 and 92. The gate electrodes of transistors 86 and 96 are coupled to clock signals C1 and C2 respectively. Input nodes 38 and 40 are coupled respectively to output nodes 32 and 34 of buffer inverters 24 and 26.

Output inverter 44 comprises P-channel field effect transistors 98 and 100 and N-channel field effect transistors 102 and 104. The source electrode of transistor 98 is coupled to $V_{DD}$ while its drain electrode is coupled to the source electrode of transistor 100. The drain electrodes of transistors 100 and 102 are coupled to output node 48. The source electrode of transistor 102 is coupled to the drain electrode of transistor 104 which has a source electrode coupled to ground. The gate electrodes of transistors 98 and 104 are coupled respectively to clock signals C1 and C2.

In order to equalize the load at input node 40 of sense amplifier 36 to the loading on input node 38, a dummy load 42 is coupled to input node 40 and comprises P-channel field effect transistors 106 and 108 and N-channel field effect transistors 110 and 112. The source electrode of transistor 106 is coupled to $V_{DD}$, and its drain electrode is coupled to the source electrode of transistor 108. The drain electrode of transistor 108 is coupled to the drain electrode of transistor 110. The source electrode of transistor 110 is coupled to the drain electrode of transistor 112 which in turn has a source electrode coupled to ground. The gate electrodes of transistors 108 and 110 are coupled to node 40, and the gate electrodes of transistors 106 and 112 are coupled respectfully to clock signal C1 and C2. If desired, an output complimentary to $S_{OUT}$ can be taken from terminal 43.

The two stage synchronizer shown in the drawing operates as follows. When clock C2 is high and clock signal C1 is low, the reference voltage appearing at node 12 will be applied to node 20, and an asynchronous input signal ($AS_{in}$) is applied via transmission gate 16 to input node 22 of sense amplifier 18. Sense amplifier 18 functions in the well known manner. That is, if the voltage appearing at node 22 is higher than that appearing at node 20, transistor 64 will turn on before transistor 66 and transistor 60 will turn off before transistor 62. When clock signal C1 next goes high and transistor C2 next goes low, transistors 68 and 58 will be rendered conductive and node 20 will be pulled low. Because this low signal is applied to the gate electrodes of transistors 62 and 66, transistor 66 will turn off and transistor 62 will turn on. This causes a higher voltage to appear at node 22. Thus, a differential voltage appears across nodes 20 and 22 with node 22 at the higher voltage.

If the input voltage at node 22 were lower than the reference voltage, a differential voltage would still appear across nodes 20 and 22; however, the higher voltage would appear at node 20. Thus, an input voltage differential equivalent to the difference between the reference voltage at node 20 and the asynchronous input signal at node 22 is applied to sense amplifier 18 during C2 and an amplified differential voltage appears across nodes 20 and 22 during the next C1.

The signals appearing at nodes 20 and 22 after amplification by sense amplifier 18 are inverted by buffer inverters 24 and 26 respectively. The voltages at nodes 32 and 34 are applied to input nodes 38 and 40 of sense amplifier 36 during C1 and the difference is substantially equal to $V_{DD}$ or to $G \cdot Al \cdot V_{in}$ where G is the gain of each of the buffer inverters, Al is the amplification of sense amplifier 18 and $V_{in}$ is the difference between the voltages at nodes 20 and 22. It is to be noted that the gain G of a CMOS inverter is very high, near a window (e.g. $+200$ mv) centered at the switchpoint and almost zero outside this window. The differential $Al \cdot V_{in}$ applied as inputs to the clocked inverters 24 and 26 must be centered about the clocked inverters common switchpoint to insure that the output differential $G \cdot Al \cdot V_{in}$ is greater than the input differential $Al \cdot \Delta V_{in}$. During the next occurrence of C2 going high and C1 going low, the differential voltage across nodes 38 and 40 will be amplified again by sense amplifier 36. Thereafter, the voltage appearing at node 38 will be inverted by output inverter 44 thus generating the resultant output signal $S_{OUT}$ at node 48.

In order to significantly reduce the probability (only infinite gain can eliminate the possibility) that small first stage differential inputs will cause meta-stable states (i.e. the outputs of sense amplifier 36 not achieving levels substantially equal to the power rails), it is necessary that differential sense amplifier 18, clocked inverters 24 and 26, differential sense amplifier 36 and clocked inverters 44 and 42 all have equivalent sizing and common switchpoints (the voltage level at which output voltage $V_0$ equals the input voltage level $V_{in}$) and that therefore all amplification occurs about a common switchpoint. The reference clocked inverter 10 should have the standard sizing and common switchpoint as amplification of a small input differential $V_{in}$ will occur as soon as C1 goes high rather than after an initial delay due to common mode movement of nodes 20 and 22 that centers these nodes about the switchpoint of the differential sense amplifier 18 followed by amplification. This is an important consideration particularly at high clock rates of 20 MHZ and above. The purpose of the clocked buffer inverters 24 and 26 is to prevent charge sharing between the input nodes of sense amplifier 36 and those at sense amplifier 18 and to provide gain to increase the input differential presented as an input to differential sense amplifier 36. If the differential between the reference voltage and the voltage of the asynchronous input signal is very small, the differential sense amplifier 18 may likewise be very small. This output will be centered around the switchpoint of differential sense amplifier 18. Sizing clocked buffer inverters 28 and 30 so that they have the same switchpoint as that of sense amplifier 18 maximizes the differential input presented to sense amplifier 36 since the gain is highest near the switch point. If the clocked buffer inverters have a different switchpoint than the differential sense amplifier 18, the output voltages at nodes 20 and 22 may be outside the high gain region of the clocked buffer inverters resulting in a small differential voltage being applied to the second stage differential sense amplifier 36.

The following table is representative of how the field effect transistors of the two stage synchronizer may be sized in order to achieve matched switch points. It is assumed that all devices have a channel drawn length of 3 microns.

| Transistor | Channel Width (Microns) | Transistor | Channel Width (Microns) |
|---|---|---|---|
| 50 | 20 | 82 | 10 |
| 52 | 20 | 84 | 10 |
| 54 | 10 | 86 | 40 |
| 56 | 10 | 88 | 20 |
| 58 | 40 | 90 | 20 |
| 60 | 20 | 92 | 10 |
| 62 | 20 | 94 | 10 |
| 64 | 10 | 96 | 20 |
| 66 | 10 | 98 | 20 |
| 68 | 20 | 100 | 20 |
| 70 | 20 | 102 | 10 |
| 72 | 20 | 104 | 10 |
| 74 | 10 | 106 | 20 |
| 76 | 10 | 108 | 20 |
| 78 | 20 | 110 | 10 |
| 80 | 20 | 112 | 10 |

The above is given by way of example only. Changes in forms and details may be made by one skilled in the art without departing from the scope of the invention as defined by the appended claims.

We claim:

1. A circuit for synchronizing an asynchronous input signal with complementary first and second clock signals comprising:

a reference inverter coupled to a source of supply voltage for generating a reference voltage at a first output thereof;

a first differential sense amplifier having a first clock input coupled to the first clock signal a second clock input coupled to the second clock signal, a first node coupled to said first output and having a second node coupled to receive said asynchronous input signal, said first differential sense amplifier for amplifying voltage differential across said first and second nodes while said first clock signal in active;

a first buffer inverter having an input coupled to said first node and having an output; and a second buffer inverter having an input coupled to said second node and having an output, said reference inverter and said first and second buffer inverters having substantially the same switch (threshold) point.

2. The circuit according to claim 1 wherein said first differential sense amplifier has substantially the same switch point as said reference inverter.

3. The circuit according to claim 2 further comprising a second sense amplifier having a third clock input coupled to the first clock signal, a fourth clock input coupled to the second clock signal, a first node coupled to the output of said first buffer inverter and having a second node coupled to the output of said second buffer inverter for amplifying the voltage difference thereacross while said second clock signal in active.

4. A circuit according to claim 3 wherein said second sense amplifier has a switch point substantially the same as said first and second buffer inverters.

5. A circuit according to claim 4 further comprising an output inverter coupled to the first node of said second sense amplifier.

6. A circuit according to claim 5 wherein said output inverter has substantially the same switch point as said reference inverter.

7. The circuit according to claim 6 further comprising load means coupled to the second node of said second sense amplifier.

* * * * *

UNITED STATES PATENT AND TRADEMARK OFFICE
CERTIFICATE OF CORRECTION

PATENT NO. : 4,663,546

DATED : May 5, 1987

INVENTOR(S) : John K. Eitrheim et al

It is certified that error appears in the above-identified patent and that said Letters Patent is hereby corrected as shown below:

In the claims:

Column 6, line 5, after "signal" insert a --,--;

Column 6, line 7, after "and" delete --having--;

Column 6, line 11, change "in" to --is--;

Column 6, line 24, before "second" insert --differential--;

Column 6, line 31, after "second" insert --differential--;

Column 6, line 36, after "second" insert --differential--;

Column 6, line 42, before "sense" insert --differential--.

Signed and Sealed this

Fifth Day of January, 1988

Attest:

DONALD J. QUIGG

Attesting Officer

Commissioner of Patents and Trademarks